United States Patent
Maeno

(10) Patent No.: US 7,186,926 B2
(45) Date of Patent: Mar. 6, 2007

(54) SURFACE MOUNTING STRUCTURE FOR SURFACE MOUNTING AN ELECTRONIC COMPONENT

(75) Inventor: Kazuhiro Maeno, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 11/056,749

(22) Filed: Feb. 11, 2005

(65) Prior Publication Data
US 2005/0178002 A1 Aug. 18, 2005

(30) Foreign Application Priority Data
Feb. 12, 2004 (JP) .......................... P2004-035498

(51) Int. Cl.
*H05K 1/16* (2006.01)
(52) U.S. Cl. .................. 174/260; 174/261; 228/180.21
(58) Field of Classification Search ................ 174/260, 174/261; 361/760; 428/180.21, 180.22
See application file for complete search history.

(56) References Cited

U.S. PATENT DOCUMENTS

| | | | | |
|---|---|---|---|---|
| 4,874,907 A | * | 10/1989 | Ishikawa | 174/261 |
| H000921 H | * | 5/1991 | Wannemacher, Jr. | 361/767 |
| 5,838,070 A | | 11/1998 | Naruse et al. | |
| 6,115,262 A | | 9/2000 | Brunner et al. | |
| 6,657,697 B2 | * | 12/2003 | Yamate et al. | 349/151 |
| 2002/0179327 A1 | | 12/2002 | Araki | |

FOREIGN PATENT DOCUMENTS

| | | |
|---|---|---|
| JP | 1-095589 | 4/1989 |
| JP | 1-189195 | 7/1989 |
| JP | 2-214196 | 8/1990 |
| JP | 2-254787 | 10/1990 |
| JP | 6-021629 | 1/1994 |
| JP | 7-336030 | 12/1995 |
| JP | 11-017308 | 1/1999 |
| JP | 2003-031937 | 1/2003 |

\* cited by examiner

Primary Examiner—Ishwar (I. B.) Patel
(74) Attorney, Agent, or Firm—Morgan & Finnegan L.L.P.

(57) ABSTRACT

A surface mounting structure for a surface mounting electronic component includes an electronic component, a circuit board and a solder fillet. The electronic component has on a marginal portion thereof a plurality of electrodes, each of which is formed so as to cover at least an under surface, both side faces and an end face of the electronic component. The circuit board has a set of lands, on which the electrodes of the electronic component are joined by soldering. Each land corresponds to one of the electrodes and has a restricting portion, which restricts movement of the electronic component at the time of solder melting during surface mounting, and also has a protrusion on each side of the corresponding electrode. The solder fillet is formed at least on each protrusion so as to correspond to both side faces of the corresponding electrode.

7 Claims, 4 Drawing Sheets

FIG. 6A
(PRIOR ART)
FIG. 6B
(PRIOR ART)
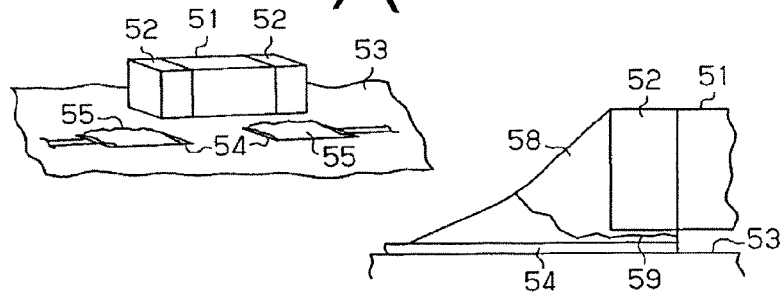
FIG. 7
(PRIOR ART)
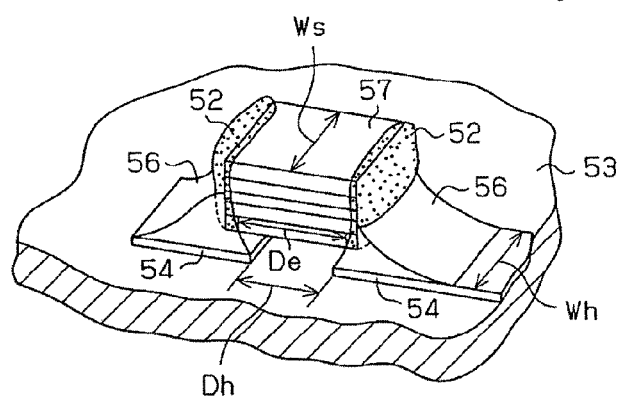

SURFACE MOUNTING STRUCTURE FOR SURFACE MOUNTING AN ELECTRONIC COMPONENT

BACKGROUND OF THE INVENTION

The present invention relates to a surface mounting structure for a surface mounting electronic component, and more particularly to a surface mounting structure for a surface mounting electronic component wherein the surface mounting electronic component is joined on a land of a circuit board by soldering.

Since a solder joint has an excellent advantage in that a bonding operation is relatively easy, that bonding strength is reliably firm and that its cost is low, the solder joint has been used for various purposes in mounting an electronic component.

Meanwhile, in order to mount the electronic component in high density for miniaturization of an electronic device, the mainstream of a mounting structure for the electronic component is changing from an insertion mount that uses a lead component to a surface mounting that uses a surface mounting electronic component (chip component).

In a case where a surface mounting electronic component such as a ceramic condenser is mounted, as shown in FIG. 6A, a chip component 51 in the shape of a rectangular parallelepiped has formed on both ends thereof an electrode 52. In a state where a circuit board 53 has formed on the surface thereof a pair of lands 54, on each of which a cream solder 55 is printed, each electrode 52 of the chip component 51 is mounted on the cream solder 55 of the corresponding land 54. Subsequently, the cream solder 55 is melted (re-flowed) in a reflow furnace by heat, thereby mounting the chip component 51 on the circuit board 53 by solder joints.

In a case where a service condition for the electronic device has temperature changes in a narrow range, normal solder joints are acceptable. However, a service condition for an electronic device for automobile use requires resistance to a temperature change between below zero and a few dozen degrees Celsius. That is, reliability in hot and cold environments and reliability in temperature cycling between the hot and cold environments are required.

In general, materials expand due to temperature rise and shrink due to temperature fall, and those degrees (coefficient of liner expansion) differ among the materials. Since the circuit board (land) side and the electronic component of a solder mounting portion for the electronic component have the different coefficients, thermal stress generates in a solder joining area between the circuit board side and the electronic component in accordance with temperature variations. As the generation of the thermal stress is repeated for an extended period, Lead(Pb)-rich $\alpha$ phase and tin(Sn)-rich $\beta$ phase of solder composition spread thereby causing grain growth. The boundary between the crystal grains of the a phase and the $\beta$ phase is fragile. Also, in a case where the land is made of copper (Cu), a Cu—Sn alloy layer is generated, however, this alloy layer is still hard and fragile. Cracks are generated mainly along such a fragile crystal grain boundary or an alloy layer. When the crack extends, the solder joining area may be broken thereby causing breakdown.

In order that breakage of the electronic component and deterioration of electrical characteristics are prevented, even if the thermal history such as heating or cooling increases during use of the electronic component mounted on the circuit board, a surface mounting structure for an electronic component is proposed such that the line width of the wiring pattern (land), the width of the electronic component, the distance between the lands, and the distance between electrodes of terminals meet a specific relation among them.

Japanese Unexamined Patent Publication No. 11-17308 discloses the surface mounting structure for an electronic component. As shown in FIG. 7, an electronic component 57 is joined on the pair of lands 54 formed on the circuit board 53 by solder 56. The surface mounting structure meets the relations $1.0 \leq Wh/Ws \leq 1.2$ and $0.8 \leq Dh/De < 1.0$ where the line width of the land 54 is Wh, the width of the electronic component is Ws, the distance between the lands 54 is Dh, and the distance between the electrodes of the terminals is De. In the surface mounting structure for the electronic component, a heat shock test is conducted until 2000 cycles. The heat shock test defines a period where the surface mounting structure is alternatively immersed in solutions of minus 40 degrees Celsius and 130 degrees Celsius as one cycle. In the surface mounting structure for the electronic component which meets the relations, the number of electronic components which have been cracked on completion of 2000 cycles does not exceed 10% of the initial number (50) of electronic components, thereby being regarded as being sufficiently reliable.

The inventors of the present application have cut a specimen which was used in a temperature cycle test and have observed its cross section. As a result, as shown in FIG. 6B, a solder fillet 58 had a crack 59 first between the under surface of the electrode 52 and the land 54, and then the crack 59 extended slowly and finally extended through the solder fillet 58. It is noted that FIG. 6B shows one side of the chip component 51. The expression "the crack 59 extends through the solder fillet 58" means that the crack extends in a sheet so as to divide the solder joining area into a land side and an electrode side, thereby preventing electric continuity between the electrode and the land.

The chip component 51 and the land 54, which have different coefficients of liner expansion, tend to cause a stress concentration on the area between the under surface of each electrode 52 of the chip component 51 and the land 54 where the chip component 51 and the land 54 lie next to each other at the closest position. It is estimated that the stress concentration is particularly great at both corners on the middle side of the chip component 51 in the area between the under surface of each electrode 52 of the chip component 51 and the land 54.

The inventors of the present application have provided the solder fillet formed between the electrode of the electronic component and the land, not only in the position corresponding to the end face of the electrode, but also in the positions corresponding to both side faces of the electrode, thereby reducing the stress concentration on the. The idea of the inventors has been proved by performing the temperature cycle test of 3000 cycles. If the solder fillet is provided only in the positions corresponding to both side faces of the electrode, the land width only has to be increased compared to the width of electronic component. However, in a case where the land width is merely increased, when the solder joint is achieved by mounting the electronic component on the cream solder printed on the land and melting the solder by heat, the electronic component deviates from its desirable position.

While Japanese Unexamined Patent Publication No. 11-17308 discloses that the line width Wh of the land 54 is equal to or more than the width Ws of the electronic component and that the line width Wh of the land 54 is equal to or less than 120% of the width Ws of the electronic component, its object is directed to breakage of the electronic component 57 and prevention of deterioration of electrical characteristics without particularly referring to the prevention of the crack generation of the solder fillet. As to the deviation of the position of the electronic component, while the cited reference discloses that the thickness of the solder existing between the electrode of the electronic component 57 and the surface of the land 54 preferably ranges between 90 μm and 500 μm inclusive of 90 μm and 500 μm, the reference does not disclose any relation between the width of the land 54 and the deviation of the position.

SUMMARY OF THE INVENTION

The present invention is directed to a surface mounting structure for a surface mounting electronic component that improves a crack-resistance to a temperature cycle while maintaining assembly operation similar to the prior art.

The present invention provides the following features. A surface mounting structure for a surface mounting electronic component includes an electronic component, a circuit board and a solder fillet. The electronic component has on a marginal portion thereof a plurality of electrodes, each of which is formed so as to cover at least an under surface, both side faces and an end face of the electronic component. The circuit board has a set of lands, on which the electrodes of the electronic component are joined by soldering. Each land corresponds to one of the electrodes and has a restricting portion, which restricts movement of the electronic component at the time of solder melting during surface mounting, and also has a protrusion on each side of the corresponding electrode. The solder fillet is formed at least on each protrusion so as to correspond to both side faces of the corresponding electrode.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments, together with the accompanying drawings, in which:

FIG. 6A is a schematic perspective view showing a prior art relationship between a pair of lands and a chip component;

FIG. 6B is a schematic side view showing a prior art crack; and

FIG. 7 is a schematic perspective view showing a prior art relationship between a pair of lands and a chip component.

DETAILED DESCRIPTION OF THE PREFERRED EMBODIMENTS

Figure 1A:
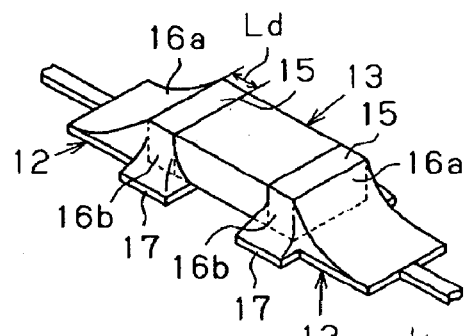
FIG. 1A is a schematic perspective view showing a state where a chip component is mounted on a pair of lands according to a preferred embodiment of the present invention.
Figure 1B:
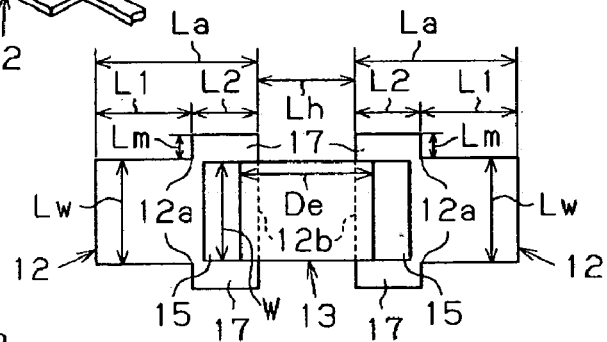
FIG. 1B is a schematic plan view showing a relationship between the lands and the chip component according to the preferred embodiment of the present invention.
Figure 1C:
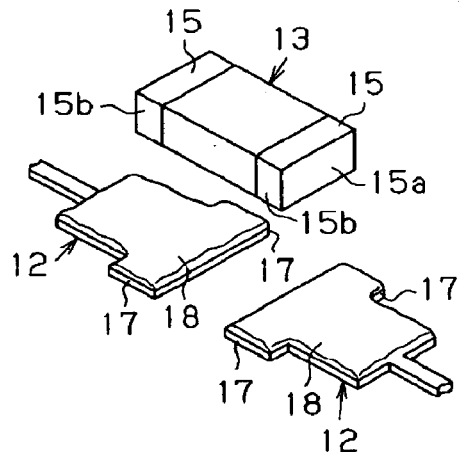
FIG. 1C is a schematic perspective view showing the relationship between the chip component and the lands according to the preferred embodiment of the present invention.
Figure 1D:
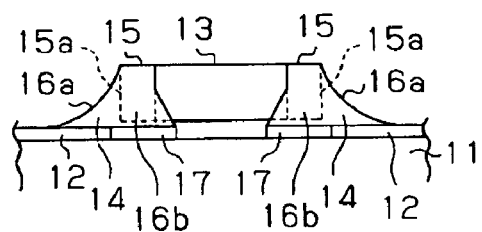
FIG. 1D is a schematic side view showing the state where the chip component is mounted on the lands according to the preferred embodiment of the present invention.
Figure 2A:
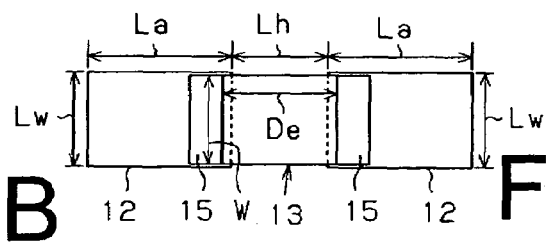
FIG. 2A is a schematic plan view showing a relationship between a chip component and a pair of lands of a comparative example.
Figure 2B:
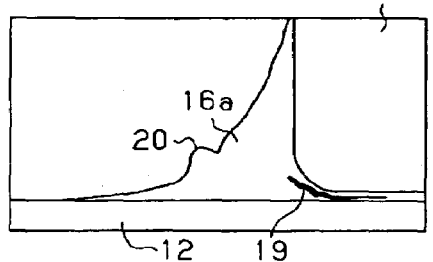
FIG. 2B is a schematic sectional view showing a state of the comparative example after a temperature cycle test is conducted.
Figure 2C:
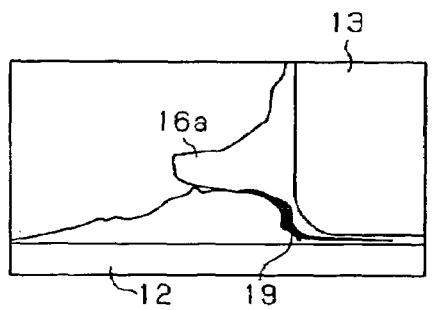
FIG. 2C is a schematic sectional view showing a state of the comparative example after the temperature cycle test is conducted.
Figure 3:
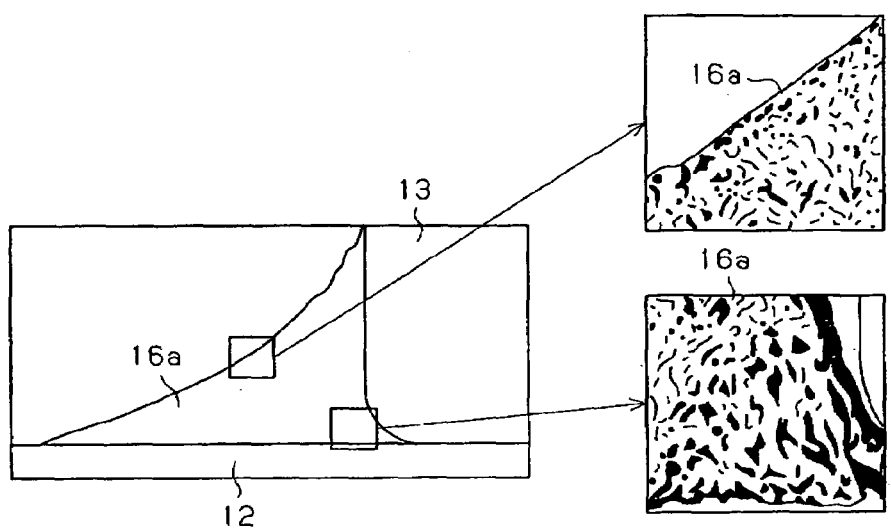
FIG. 3 is a schematic sectional view showing a state of a practical example after the temperature cycle test is conducted.

A preferred embodiment of the present invention will now be described with reference to FIGS. 1A–1D, 2A–2C and 3. FIG. 1A is a schematic perspective view showing a state where a chip component is mounted on a pair of lands according to a preferred embodiment of the present invention. FIG. 1B is a schematic plan view showing a relationship between the lands and the chip component according to the preferred embodiment of the present invention. FIG. 1C is a schematic perspective view showing the relationship between the chip component and the lands according to the preferred embodiment of the present invention. FIG. 1D is a schematic side view showing the state where the chip component is mounted on the lands according to the preferred embodiment of the present invention. FIG. 2A is a schematic plan view showing a relationship between a chip component and a pair of lands of a comparative example. FIG. 2B is a schematic sectional view showing a state of the comparative example after a temperature cycle test is conducted. FIG. 2C is a schematic sectional view showing a state of the comparative example after the temperature cycle test is conducted. FIG. 3 is a schematic sectional view showing a state of a practical example after the temperature cycle test is conducted. It is noted that FIGS. 1A–1D and 2A–2C omit diagrammatic representations of solder resists for preventing solder from sticking on a wiring board other than the place to be soldered.

As shown in FIGS. 1A and 1D, a circuit board 11 (not shown in FIG. 1A) has formed on a surface thereof a pair of lands 12, on the pair of which a chip component 13 serving as a surface mounting electronic component is joined with solder 14. The chip component 13 is soldered on the lands 12 which form a conductor pattern formed on the surface of the circuit board 11 by a reflow soldering method. That is, the chip component 13 is mounted on the surface of the circuit board 11. The chip component 13 has a pair of electrodes 15 each of which has an end face 15a and a pair of side faces 15b. The lands 12 and the electrodes 15 are joined to each other respectively by solder fillets, each of which has a front fillet 16a and a pair of side fillets 16b. The front fillet 16a is formed in a position corresponding to the end face 15a of the electrode 15, and each side fillet 16b is formed in a position corresponding to the associated side face 15b of the electrode 15. The chip component 13 includes a ceramic condenser.

In the present embodiment, the chip component 13 is formed in the shape of a rectangular parallelepiped, and has formed on both ends in a longitudinal direction thereof the electrodes 15 by means such as plating. That is, the chip component 13 has on a marginal portion thereof a plurality of electrodes 15, each of which is formed so as to at least cover the surface (the under surface) of the chip component 13 which faces the land 12, both side faces thereof and the end face thereof.

As shown in FIG. 1B, the land 12 has a restricting portion 12a which restricts movement of the chip component 13 at the time of solder melting during surface mounting, and also has a protrusion 17 on each side of the corresponding electrode 15. The side fillet 16b is formed on each protrusion 17. In the present embodiment, the restricting portion 12a is formed by a corner at a boundary between a portion of the land 12, which has substantially the same width as the chip component 13, and the protrusion 17. A length L1 of the portion of the land 12 corresponding to the end face 15a of the electrode 15 in a direction perpendicular to the end face 15a is formed so as to be larger than maximum length Lm of the protrusion 17 in a direction perpendicular to the side face 15b of the electrode 15. In the present embodiment, the protrusion 17 is formed in a rectangular shape.

The protrusion 17 preferably extends in a direction of the width of the land 12 by 10% of the width of the electrode 15 or above, and more preferably extends in the direction by 20% thereof or above. That is, the protrusion 17 is preferably formed so that the maximum length Lm thereof in the direction perpendicular to the side face 15b of the electrode 15 is 10% of the width of the electrode 15 or above, and is more preferably formed so that the maximum length Lm is 20% of the width of the electrode 15 or above. While the maximum length Lm is desirably lengthened in order to form the side fillet 16b, the lengthened maximum length Lm lowers mounting density for the chip component 13. Therefore, the maximum length Lm is suitably determined in accordance with a needed mounting density.

A length L2 of the protrusion 17 along the side face 15b of the electrode 15 is formed so as to be larger than a length Ld of the side face 15b of the electrode 15. That is, the protrusion 17 protrudes from the inside end of the electrode 15 of the chip component 13 toward the opposed land 12 in a direction along the side face 15b of the electrode 15. The side fillet 16b is formed so as to cover both corners on the side of the chip component 13, in which generation of stress concentration is estimated to be particularly great, in the area between the under surface of the electrode 15 on the end of the chip component 13 and the land 12. In the present embodiment, the protrusion 17 protrudes from the end face 15a toward the counter side to the opposed land 12 in the direction along the side face 15b of the electrode 15. It is noted that the inside end of the electrode 15 of the chip component 13 means an end of the electrode 15 located on the middle side of the chip component 13.

The land 12 has a portion 12b that protrudes from the inside end of the electrode 15 of the chip component 13 toward the middle of the chip component 13. The portion 12b is formed along the full length in the direction of the width of the electrode 15. In the present embodiment, an end of the protrusion 17 and a protruding end of the portion 12b are formed on the identical straight line.

In a case where the chip component 13 is mounted on the surface of the land 12, in a state where the surface of the circuit board 11 is covered with solder resist except for a portion necessary for soldering, as shown in FIG. 1C, cream solder 18 is printed on the land 12. The electrodes 15 of the chip component 13 are mounted on the cream solder 18. Subsequently, the circuit board 11 is entered into a reflow furnace in which the cream solder 18 is melted (reflowed) by heat, thereby mounting the chip component 13 on the circuit board 11 by solder joints. Since the land 12 has the restricting portion 12a, self-alignment of the chip component 13 is achieved at the time of solder melting. Consequently, the chip component 13 is mounted on the land 12 and is prevented from deviating from its suitable position.

In order to check the durability to the temperature cycle of the above-mentioned surface mounting structure, a temperature cycle test is conducted until 3000 cycles. A crack state is observed when every 1000 cycles finish. The temperature cycle test is also conducted for a comparative example in a case where the chip component 13 is mounted on a predetermined width of land 12 which is shown in FIG. 2A. In a similar manner to the above-mentioned surface mounting structure, the crack state is observed when every 1000 cycles finish. Specifically, in a state where a sample which has passed a predetermined cycle is molded by a resin mold and the front fillet 16a of the molded sample is cut by a plane that is parallel to the longitudinal direction of the chip component 13 and is perpendicular to the land 12, the crack state in the cut surface is observed.

The sample of the practical example uses the dimensions shown in FIG. 1B, where the land width Lw is 1.7 mm, the maximum length Lm is 0.4 mm, the distance between lands Lh is 1.5 mm and the land length La is 2.5 mm. Meanwhile, two kinds of samples are prepared for comparative examples. One of the samples uses the dimensions shown in FIG. 2A, where the land width Lw is 1.7 mm, the land length La is 2.5 mm and the distance between lands Lh is 1.5 mm. The other sample uses the dimensions shown in FIG. 2A, where the land width Lw is 1.7 mm, the land length La is 2.5 mm and the distance between lands Lh is 1.7 mm. The chip component 13 has a width W of 1.6 mm and a distance between electrodes De that ranges from 2.0 to 2.2 mm, for both the practical example and the comparative examples. The number of samples is 24 for each of the practical example and the comparative examples.

The temperature cycle test defines a period where the temperature is alternatively maintained between minus 40 degrees Celsius and 90 degrees Celsius as one cycle. As a test result, on completion of 1000 cycles no crack that causes rejection is observed in both of the practical example and the comparative examples. On completion of 2000 cycles, while no crack that causes rejection is observed in the practical example, one crack that causes rejection is observed in the comparative example whose distance between lands Lh is 1.5 mm. The length of the observed crack is equal to or more than half of the thickness in a traveling direction of the crack.

On completion of 3000 cycles, while no crack that causes rejection is observed in the practical example, cracks that cause rejection are observed in both of the comparative examples. In the comparative example whose distance between lands Lh is 1.7 mm, the number of rejected articles whose crack length is equal to or more than half of the thickness in the traveling direction of the crack is four. In addition, the number of rejected articles whose crack extends through the front fillet 16*a* in the traveling direction of the crack is one. Also, in the comparative example whose distance between lands Lh is 1.5 mm, the number of rejected articles whose crack length is equal to or more than half of the thickness in the traveling direction of the crack is two. In addition, the number of rejected articles whose crack extends through the front fillet 16*a* in the traveling direction of the crack is two.

In the comparative example whose distance between lands Lh is 1.7 mm, the development of a typical crack will be described. FIG. 2B shows a sectional view of the front fillet 16*a* on completion of 2000 cycles. First, the under surface of the electrode 15 of the chip component 13, which faces the land 12, and the land 12 have developed therebetween a crack 19. The reason the crack 19 is formed is considered that stress tends to concentrate on a relatively thin solder layer between the land 12 and the chip component 13 that adjacently face each other. The front fillet 16*a* has generated on a mountainside thereof a step 20 caused by a sliding phenomenon of metal which is considered to be caused by shear stress generated between the chip component 13 and the land 12. Thereafter, the crack 19 is developed toward the step 20, and finally extends through the front fillet 16*a*. FIG. 2C shows a sectional view of the front fillet 16*a* on completion of 3000 cycles. In the comparative example whose distance between lands Lh is 1.5 mm, the crack 19, which finally extends through the front fillet 16*a*, changes as described in the comparative example whose distance between lands Lh is 1.7 mm. It is noted that FIGS. 2B and 2C omit diagrammatic representations of hatching showing section.

FIG. 3 shows a sectional view of the front fillet 16*a* of the practical example, in which no crack that causes rejection is observed, even on completion of 3000 cycles. This sectional view is based on the pictures observed by using a metallographic microscope. In partial enlarged views of FIG. 3, a black portion of the front fillet 16*a* is lead-rich a phase and the other portion thereof is tin-rich β phase (not shown in FIGS. 2B and 2C). Around the area between the under surface of the electrode 15 of the chip component 13, which faces the land 12, and the land 12, which is first cracked, lead and tin of the solder composition spread in both of the αphase and the βphase, and a state of grain growth is observed. However, in the mountainside of the front fillet 16*a*, which causes the step 20 in the comparative examples, the aforementioned grain growth is hardly observed, and a fine crystalline state is observed in both of the a phase and the βphase. In addition, the generation of the step 20 is relatively few. It is noted that FIG. 3 also omits diagrammatic representation of hatching showing section.

In the practical example, the side fillet 16*b* is formed evenly in the position corresponding to the side face 15*b* of the electrode 15. The side fillet 16*b* exists so as to cover the corners, in which generation of a stress concentration is estimated to be particularly great, in the area between the under surface of the electrode 15 of the chip component 13 and the land 12. Therefore, stress concentration on the front fillet 16*a* is reduced, and the grain growth of the α phase and the β phase is restricted around the area between the under surface of the electrode 15 of the chip component 13, which faces the land 12, and the land 12. As a result, there considered that the development of crack is restrained.

The present embodiment has the following advantageous effects.

(1) In a mounting structure of the chip component 13 which is mounted on the land 12 of the circuit board 11 with the solder 14, the land 12 has the restricting portion 12*a* which restricts movement of the chip component 13 at the time of solder melting during the surface mounting, and also has the protrusion 17 on each side of the corresponding electrode 15. The side fillet 16*b* is formed on each protrusion 17. Therefore, even if the width Lw of the land 12 is widened by the length of "Lm×2" that is needed to suitably form the side fillet 16*b* on each side of the electrode 15, in a case where the solder joint is achieved by mounting the chip component 13 on the cream solder 18 printed on the land 12 and melting the solder by heat, the deviation of the position of the chip component 13 from the suitable position is prevented, thus improving crack resistance to the temperature cycle while maintaining assembly operating performance as is conventionally done. For example, in the temperature cycle test, the crack resistance to the surface mounting structure of the present embodiment is 3000 cycles or above.

(2) The protrusion 17 protrudes from the inside end of the electrode 15 of the chip component 13 toward the opposed land 12 in the direction along the side face 15*b* of the electrode 15. Therefore, the side fillet 16*b* exists so as to cover the corners, in which generation of a stress concentration is estimated to be particularly great. As a result, the crack resistance to the temperature cycle is further improved.

(3) The protrusion 17 protrudes in the direction of the width of the land 12 by 10% of the width of the electrode 15 or above. Therefore, in addition to the front fillet 16*a*, a suitably-sized side fillet 16*b* which joins the land 12 and the electrode 15 together is formed in the position corresponding to the side face 15*b* of the electrode 15.

(4) The land 12 has the portion 12*b* that protrudes from the inside end of the electrode 15 of the chip component 13 toward the middle of the chip component 13. Therefore, thermal stress generated between the under surface of the electrode 15, which faces the land 12, and the land 12 is further reduced.

(5) The protrusion 17 is formed in a rectangular shape, and the length L2 of the protrusion 17 in the direction along the side face 15*b* of the electrode 15 is formed so as to be larger than the length Ld of the side face 15*b* of the electrode 15. The portion 12*b* of the land 12 protruding toward the middle of the chip component 13 is formed along the full length in the width direction of the electrode 15. Therefore, compared to a case where the protrusion 17 is formed in a semicircular shape (in the shape of a sector of a circle), in a case where the maximum length Lm of the rectangular protrusion 17 in a direction perpendicular to the side face 15*b* of the electrode 15 is the same size as that of the semicircular protrusion 17, the area of the protrusion 17 is increased, thereby easily ensuring that a suitable amount of solder forms the side fillet 16*b* on the side face 15*b* of the electrode 15.

(6) Since the protrusions 17 are symmetrically formed relative to the land 12, compared to a case where the protrusions 17 are asymmetrically formed relative to the land 12, the chip component 13 tends to be mounted accurately in a prescribed position with solder.

The present invention is not limited to the above-described embodiment, but may be embodied in the following manner.

Figure 4A:
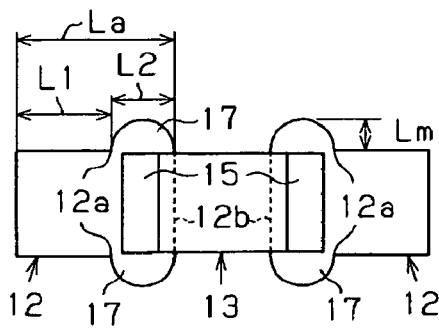
FIG. 4A is a schematic plan view showing a relationship between a pair of lands and a chip component according to another preferred embodiment of the present invention.
Figure 4B:
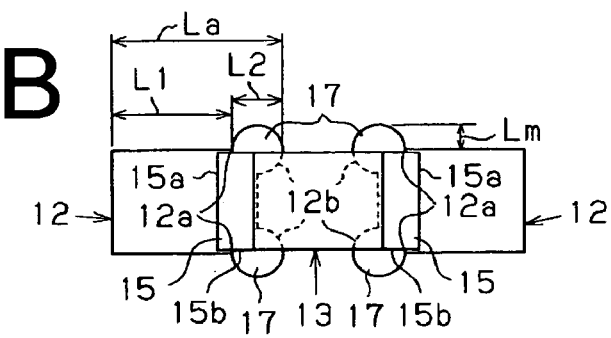
FIG. 4B is a schematic plan view showing a relationship between a pair of lands and a chip component according to another preferred embodiment of the present invention.
Figure 5A:
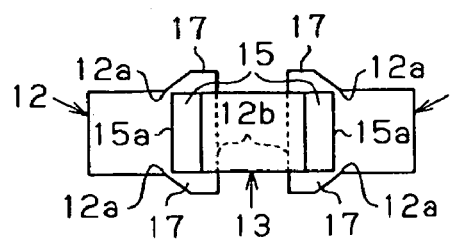
FIG. 5A is a schematic plan view showing a relationship between a pair of lands and a chip component according to another preferred embodiment of the present invention.
Figure 5B:
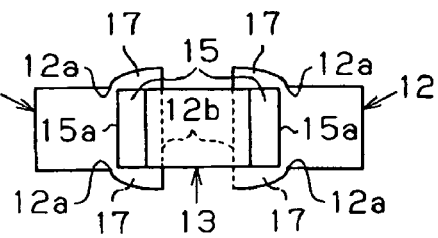
FIG. 5B is a schematic plan view showing a relationship between a pair of lands and a chip component according to another preferred embodiment of the present invention.
Figure 5C:
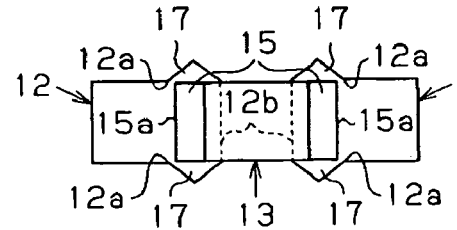
FIG. 5C is a schematic plan view showing a relationship between a pair of lands and a chip component according to another preferred embodiment of the present invention.
Figure 5D:
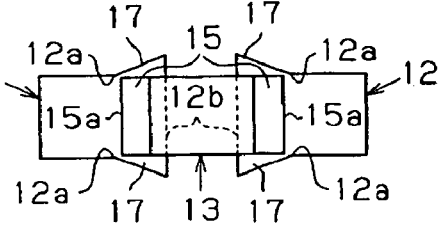
FIG. 5D is a schematic plan view showing a relationship between a pair of lands and a chip component according to another preferred embodiment of the present invention.

The shape of the protrusion 17 is not limited to the shape of the above-described embodiment. As shown in FIG. 4A, the protrusion 17 is formed in a semicircular shape whose diameter is longer than the length Ld of the side face 15b of the electrode 15. The portion 12b of the land 12 protruding toward the middle of the chip component 13 may be formed along the full length in the width direction of the electrode 15. Also, as shown in FIG. 4B, the protrusion 17 is formed in the shape of a sector of a circle whose radius is equal to or less than the length Ld of the side face 15b of the electrode 15. In addition, the center of the protrusion 17 in the shape of the sector of the circle may be positioned so as to correspond to the inside end of the electrode 15. In this case, the portion 12b of the land 12 protruding toward the middle of the chip component 13 is formed in the shape of a quarter circle. It is noted that the expression "a sector of a circle" means a figure in a form that is surrounded by an arc and a straight line, inclusive of the figure in which the position of the center of the sector does not coincide with one end of the curvature radius of the arc. In addition, the value of its central angle is not limited to 180 degrees or below, but may exceed 180 degrees. The same temperature cycle test (each number of samples is 24) as in the preferred embodiment has been conducted for the samples such that the chip component 13 is mounted on two pairs of lands 12, respectively having the shapes shown in FIGS. 4A and 4B, however, such a crack that causes rejection was not observed on completion of 3000 cycles.

In the land 12 shown in FIG. 4B, the protrusion 17 does not correspond to the full length of the side face 15b of the electrode 15, in other words, the protrusion 17 is not formed near the end face 15a of the electrode 15, however, the temperature cycle test has brought a favorable result. This result means that the side fillet 16b formed between the side face 15b and the protrusion 17 does not necessarily need to be formed along the full length of the side face 15b. The similar effects (1) through (3) and (5) to those in the preferred embodiment are also obtained in a surface mounting structure that uses the lands 12 having shapes shown in FIGS. 4A and 4B. In the land 12 shown in FIG. 4B, the restricting portion 12a has not only a corner at the boundary between the portion of the land 12 whose width is substantially the same as that of the chip component 13, and the protrusion 17, but also a part of the portion of the land 12, of which width is substantially the same as that of the chip component 13. As a result, the self-alignment at the time of solder melting during the surface mounting is favorably performed.

The land 12 has the restricting portions 12a that restrict the movement of the chip component 13 at the time of solder melting, and also has the protrusion 17 on each side of the corresponding electrode 15. The side fillet 16b is formed on each protrusion 17. Preferably, the length L1 of the portion of the land 12 corresponding to the end face 15a of the electrode 15 in the direction perpendicular to the end face 15a is formed so as to be larger than the maximum length Lm of the protrusion 17 in the direction perpendicular to the side face 15b of the electrode 15. The shapes of the lands 12 shown in FIGS. 5A through 5D are also applicable. In the shapes of the lands 12 shown in FIGS. 5A through 5D, while the shapes of the protrusions 17 are different from each other, the widths of the protrusions 17 corresponding to the end faces 15a of the electrodes 15 are formed in a prescribed length. It is noted that the protrusions 17 shown in FIGS. 5A through 5D have a trapezoidal shape, a shape formed by a curve and a straight line, an isosceles triangular shape and a right triangular shape, respectively. In this case, the restricting portion 12a is formed by the corner at the boundary between the portion of the land 12, which has substantially the same width as the chip component 13, and the protrusion 17.

The land 12 may be formed so that the width of the portion of the land 12 corresponding to the end face 15a of the electrode 15 decrease as distanced from the end face 15a in a case where the visible outlines of the land 12 are bent in the restricting portions 12a.

The land 12 does not necessarily need to have the portion 12b that protrudes from the inside end of the electrode 15 of the chip component 13 toward the middle of the chip component 13. In the above-mentioned embodiments, the portion 12b that protrudes from the inside end of the electrode 15 of the chip component 13 toward the middle of the chip component 13 may be eliminated from the land 12. The land 12b does not need to be continuously formed with the protrusion 17, but may be formed separately from the protrusion 17.

The protrusion 17 needs to be formed in size such that the side fillet 16b is formed at least between the protrusion 17 and the side face 15b of the electrode 15. That is, the side fillet 16b does not necessarily need to be formed along the full length of the side face 15b. The protrusion 17 does not necessarily need to have a portion that protrudes from the inside end of the electrode 15 toward the opposed land 12.

Although in the above-mentioned embodiments each land 12 has a symmetrical shape with respect to the center line Lc, the land 12 does not need to have the symmetrical shape with respect to the center line Lc. The paired protrusions 17 of the land 12 may have different shapes from each other. However, if the land 12 has a symmetrical shape, self-alignment of the chip component 13 at the time of solder melting during the surface mounting is smoothly achieved.

As to a method of forming the land 12 in a desired shape, the method is not restricted to form the land 12 in the desired shape by etching or plating a conductor pattern of the land 12. For example, solder resist machining may be performed by forming an opening of the land in a desired shape on a solid conductor pattern of which width is larger than that of the land 12.

The chip component (electronic component) 13 needs only to have on a marginal portion thereof a plurality of electrodes, each of which is formed so as to cover at least the under surface of the chip component 13, which faces the land 12, both side faces of the chip component 13 and the end face of the chip component 13. The chip component 13 is not necessarily restricted to a shape such that a pair of electrodes is formed on both ends of a rectangular parallelepiped, and may have three or more electrodes.

The chip component (electronic component) 13 needs only to be formed so that each electrode covers at least the under surface of the chip component 13, which faces the land 12, both side faces of the chip component 13 and the end face of the chip component 13. The chip component 13 is not restricted to the ceramic condenser, but may be a resistance or a diode. The resistance in the shape. of a chip does not generally have on both side faces thereof a pair of electrodes.

In a case where a plurality of chip components 13 are mounted by using the lands 12 having the protrusions 17, if the chip components 13 are arranged parallel to each other and the lands 12 of the adjacent chip components 13 are also adjacently juxtaposed, the distance between the adjacent lands 12 needs to be distanced in order to ensure an insulation distance compared to the case where the lands 12 do not have the protrusions 17. However, if the lands 12 are arranged so as to arrange the chip components 13 in zigzag, the chip components 13 are mounted in a state that the distance between the adjacent chip components 13 is substantially the same for the case where the lands 12 do not have the protrusions 17.

If a size of the chip component 13 is varied, the values such as the land width Lw, the maximum length Lm, the distance between lands Lh and the land length La are modified in accordance with the size.

The solder for use in the surface mounting is not restricted to the alloy of lead and tin, but may be so-called a leadfree solder which is made of an alloy of tin as a main component and metal other than lead.

Therefore, the present examples and embodiments are to be considered as illustrative and not restrictive and the invention is not to be limited to the details given herein but may be modified.

What is claimed is:

1. A surface mounting structure for a surface mounting electronic component, comprising:
   an electronic component having on a marginal portion thereof a plurality of electrodes, each of which is formed so as to cover at least an under surface, both side faces and an end face of the electronic component;
   a circuit board having a set of lands, on which the electrodes of the electronic component are joined by soldering, each land corresponding to one of the electrodes and having a restricting portion, which restricts movement of the electronic component at the time of solder melting during surface mounting, and also having a protrusion so as to correspond to each of the side faces of the corresponding electrode; and
   a solder fillet having a front fillet formed in a position corresponding to the end face of the electrode and a side fillet formed on each protrusion of the land, a portion of the land which corresponds to the front fillet having substantially the same width as the electronic component, the restricting portion being formed between the portion of the land which corresponds to the front fillet and the corresponding protrusion, the side fillet being separately formed from the front fillet, the protrusion of the land being formed so as to protrude from an inside end of the corresponding electrode toward an opposed land of the set of lands in a direction along the side face of the corresponding electrode, whereby the side fillet is formed so as to cover both corners on the middle side of the electronic component in an area between the under surface of the corresponding electrode and the corresponding land.

2. The surface mounting structure according to claim 1, wherein each land has a portion that protrudes from the inside end of the corresponding electrode toward a middle of the electronic component.

3. The surface mounting structure according to claim 1, wherein each protrusion of one of the lands is formed in a rectangular shape, a length of each rectangular protrusion along a side face of the corresponding electrode being formed so as to be larger than that of the side face of the corresponding electrode, a portion of the one land that protrudes toward a middle of the electronic component being formed along a full length in a width direction of the corresponding electrode.

4. The surface mounting structure according to claim 1, wherein the front fillet is formed on an end face of one of the electrodes of the electronic component, the side fillet is formed between one of the protrusions of the corresponding land and at least a part of a pair of side faces of the one electrode of the electronic component, the side fillet protruding at least from both corners on the middle side of the electronic component in an area between an under surface of the one electrode of the electronic component and the corresponding land, to an opposed land, thereby reducing thermal stress applied to the area or the front fillet.

5. The surface mounting structure according to claim 1, wherein a visible outline of each land is formed, which matches an end face of the corresponding electrode, and the visible outline in a width direction of the protrusion of that land is bent in the restricting portion of that land.

6. The surface mounting structure according to claim 1, wherein a length of the portion of the land which corresponds to the front fillet in a direction perpendicular to the end face of the electrode is formed so as to be larger than maximum length of the protrusion in a direction perpendicular to the side face of the electrode.

7. The surface mounting structure according to claim 1, wherein the restricting portion has not only a corner at the boundary between the portion of the land which corresponds to the front fillet and the protrusion, but also a part of the portion of the land which corresponds to the front fillet.

* * * * *

UNITED STATES PATENT AND TRADEMARK OFFICE
CERTIFICATE OF CORRECTION

PATENT NO. : 7,186,926 B2  
APPLICATION NO. : 11/056749  
DATED : March 6, 2007  
INVENTOR(S) : Kazuhiro Maeno Page 1 of 1

It is certified that error appears in the above-identified patent and that said Letters Patent is hereby corrected as shown below:

IN THE SPECIFICATION

Column 1, line 54, please delete "grains of the a" and insert therefore -- grains of the α --;

Column 2, line 26, please delete "cross section" and insert therefore -- cross-section --;

Column 2, line 51, please delete "concentration on the." and insert therefore -- concentration on the corners --;

Column 2, line 56, please delete "width of electronic component." and insert therefore -- width of the electronic component. --;

Column 7, lines 42 and 52, please delete "a phase" and insert therefore -- α phase --;

Column 7, line 48, please delete "αphase and βphase" and insert therefore -- α phase and β phase --;

Column 7, line 53, please delete "βphase" and insert therefore -- β phase --;

Column 7, lines 66-67, please delete "result, there considered that the development" and insert therefore -- result, the development --; and Column 10, line 57, please delete "shape. of a chip" and insert therefore -- shape of a chip --.

Signed and Sealed this

Twenty-fifth Day of August, 2009

David J. Kappos  
*Director of the United States Patent and Trademark Office*